United States Patent [19]

Hori

[11] Patent Number: 5,283,533
[45] Date of Patent: Feb. 1, 1994

[54] AMPLIFIER SIGNAL LEVEL DETECTOR FOR A MOBILE COMMUNICATION SYSTEM

[75] Inventor: Tsuguo Hori, Tokyo, Japan

[73] Assignee: NEC Corporation, Tokyo, Japan

[21] Appl. No.: 929,682

[22] Filed: Aug. 13, 1992

[30] Foreign Application Priority Data

Aug. 20, 1991 [JP] Japan .................................. 3-208066

[51] Int. Cl.⁵ .......................... G01R 19/00; H03G 3/20
[52] U.S. Cl. .......................................... 330/2; 330/134; 330/279
[58] Field of Search .................. 330/2, 129, 134, 279; 455/116, 126, 127, 232.1; 375/68, 70, 71, 98

[56] References Cited

U.S. PATENT DOCUMENTS 3,434,065 3/1969 Chu et al. .................................. 330/2

Primary Examiner—James B. Mullins
Attorney, Agent, or Firm—Laff, Whitesel, Conte & Saret

[57] ABSTRACT

A detector for detecting changes in the output level of an amplifier included in, for example, a mobile communication signal. A first detecting circuit produces a detected voltage having linearity against low output levels of the amplifier. A second detecting circuit produces a detected voltage which is linear against high output levels of the amplifier. The detected voltages from the first and second detecting circuits are mixed by a mixer in a predetermined ratio. Even when the output level of the amplifier changes over a broad dynamic range, the detector detects the changes with accuracy.

2 Claims, 4 Drawing Sheets

AMPLIFIER SIGNAL LEVEL DETECTOR FOR A MOBILE COMMUNICATION SYSTEM

BACKGROUND OF THE INVENTION

The present invention relates to a detector for accurately detecting changes in the level of an amplifier which amplifies an input signal whose level changes and, more particularly, to a detector for an amplifier included in a mobile communication system.

A prerequisite with a mobile communication system is that changes in the output level of an amplifier be accurately detected to insure accurate control over the output of the amplifier. To meet this requirement, it has been customary to use a coupling circuit for extracting the output of the amplifier, to which an input signal whose level changes is applied, in a predetermined coupling amount. A detector detects the output of the coupling circuit to thereby detect changes in the output level of the amplifier. The detector, however, cannot detect the output of the amplifier accurately when the output level of the amplifier noticeably changes. This problem is particularly serious in the case of a mobile communication system. Specifically, in a mobile communication system, since a mobile station freely moves throughout a cell, the electric field of a signal received by a base station changes with the varying position of the mobile station. For example, when the mobile station is located near the base station, both the input to the base station and the input to the mobile station are excessive. This would generate undesirable waves due to cross modulation or similar cause. In the light of such a situation, it is a common practice with a mobile communication system to change the output level of the amplifier over a substantial range, e.g., even by 30 dB, so that the electric field of an input signal may remain constant. It is, therefore, necessary for the detector to detect changes in the output level of the amplifier with accuracy. However, a conventional detector using a diode cannot detect the changes accurately since the diode characteristic is not linear over a substantial range.

SUMMARY OF THE INVENTION

It is, therefore, an object of the present invention to provide a detector capable of producing a detected signal with sufficient linearity even when the output level of an amplifier changes over a broad range.

A detector connected to an amplifier which amplifies an input signal whose level changes for generating a detected signal associated with the output signal of the amplifier of the present invention comprises a first coupling circuit for picking up the output signal of the amplifier in a predetermined coupling amount, a second coupling circuit for picking up the output signal of the first coupling circuit in a predetermined coupling amount, a first detecting circuit for detecting the output signal of the first coupling circuit to thereby produce a detected voltage which has linearity against, among changes in the level of the input signal to the amplifier, changes in a relatively low range, a second detecting circuit for detecting the output signal of the second coupling circuit to thereby produce a detected voltage which has linearity against, among the changes in the level of the input signal to the amplifier, changes in a relatively high range, and a mixer for mixing the detected voltages produced by the first and second detecting circuits in a predetermined ratio to thereby generate the detected signal.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
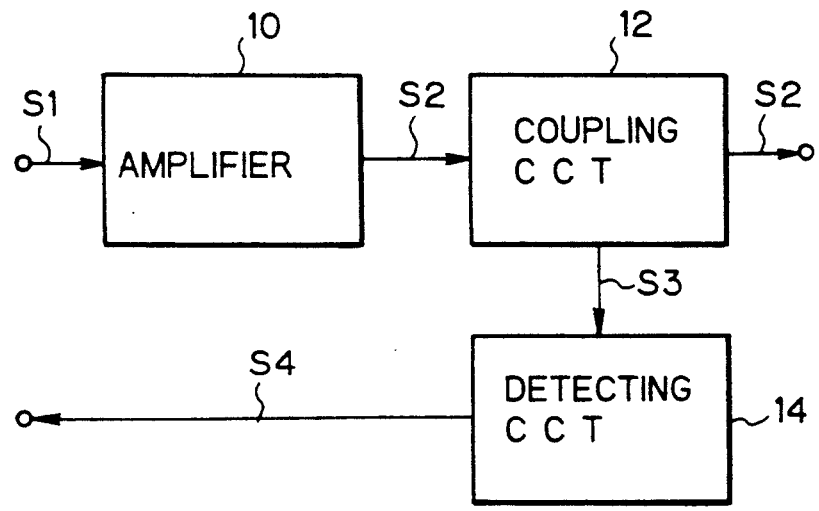
FIG. 1 is a block diagram schematically showing a conventional detector.
Figure 2:
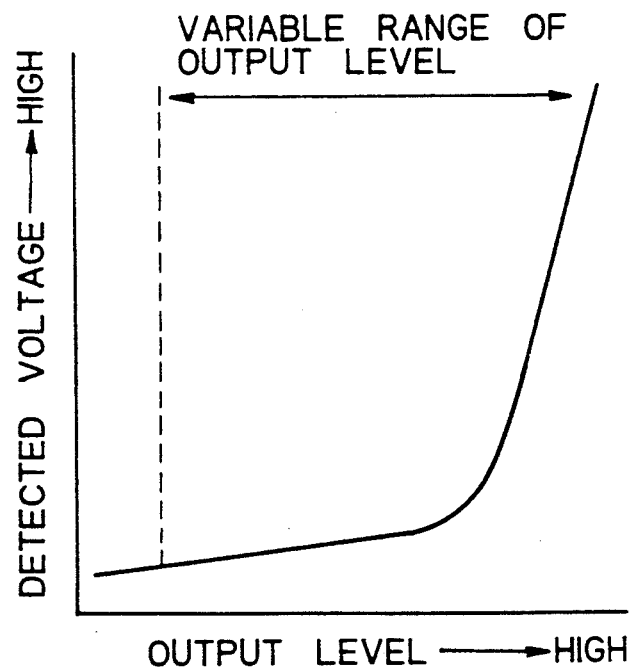
FIG. 2 is a graph indicative of a relation between the output level of an amplifier and a signal detected by the detector shown in FIG. 1.

To better understand the present invention, a brief reference will be made to a conventional detector, shown in FIG. 1. As shown, the detector is configured to detect changes in the output level of an amplifier 10 included in, for example, a mobile communication system. Specifically, an input signal $S_1$ whose level changes is applied to and amplified by the amplifier 10 to be thereby converted to an output signal $S_2$. The output signal $S_2$ of the amplifier 10 is fed to a coupling circuit 12 which then extracts the signal $S_2$ in a predetermined coupling amount. The resulting output $S_3$ of the coupling circuit 12 is delivered to a detecting circuit 14. Then, the detecting circuit 14 produces a signal $S_4$. With this configuration, it is possible to detect changes in the level of the output signal $S_2$ of the amplifier 10. However, the conventional detector has a problem left unsolved, as discussed earlier.

Figure 3:
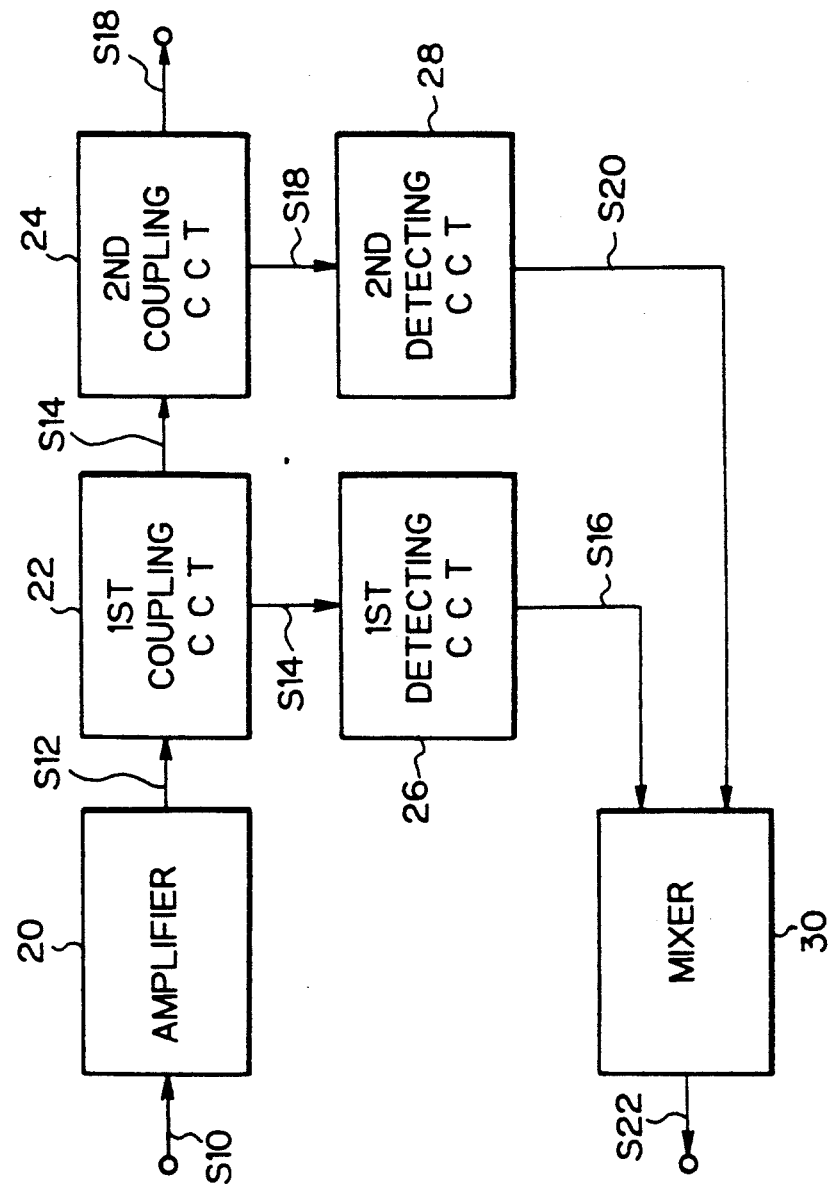
FIG. 3 is a block diagram schematically showing a detector embodying the present invention.

Referring to FIG. 3, a detector embodying the present invention is shown which is constructed to eliminate the problem particular to the conventional detector. As shown, the detector has a first coupling circuit 22 connected to an amplifier 20 to which an input signal $S_{10}$ whose level changes is applied. The first coupling circuit 22 picks up the output signal $S_{12}$ of the amplifier 20 in a predetermined coupling amount and feeds an output signal $S_{14}$ thereof to a second coupling circuit 24 and a first detecting circuit 26. The second coupling circuit 24 picks up the input signal $S_{14}$ in a predetermined coupling amount. The first detecting circuit 26 detects the input signal $S_{14}$ and produces a detected voltage $S_{16}$ which remains linear against, among the changes in the level of the signal $S_{10}$, the changes in a relatively low range. A second detecting circuit 28 is connected to the second coupling circuit 24 so as to detect the output $S_{18}$ of the circuit 24 and output a detected voltage $V_{20}$ which remains linear against, among the changes in the level of the signal $S_{10}$, the changes in a relatively high range. A mixer 30 mixes the detected voltages $S_{16}$ and $S_{20}$ of the first and second coupling circuits 26 and 28 in a predetermined ratio, thereby outputting a detected signal $S_{22}$.

In operation, the amplifier 20 amplifies the input signal $S_{10}$ to a predetermined value and feeds the resulting signal $S_{12}$ to the first coupling circuit 22. The first coupling circuit 22 picks up the signal $S_{12}$ in a predetermined coupling amount and delivers the coupled signal $S_{14}$ to the second coupling circuit 24 and first detecting circuit 26. The second coupling circuit 24 picks up the coupled output $S_{14}$ of the first coupling circuit 22 in a predetermined coupling amount and delivers the output $S_{18}$ thereof to the second detecting circuit 28. On receiving the coupled outputs $S_{14}$ and $S_{18}$ from the first and second coupling circuits 22 and 24, respectively, the first and second detecting circuits 26 and 28 output respectively the detected voltages $S_{16}$ and $S_{20}$ matching the levels of the associated coupled outputs $S_{14}$ and $S_{18}$.

Figure 4:
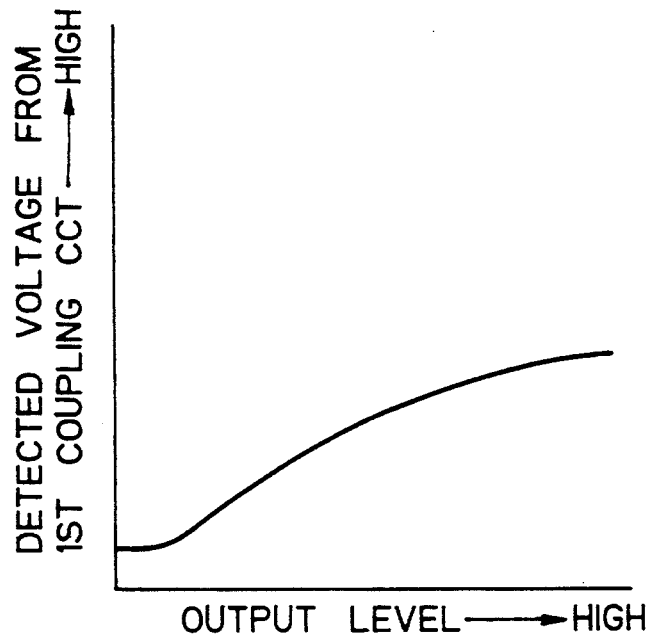
FIG. 4 is a graph showing a relation between the output level of an amplifier and a signal detected by a first detecting circuit included in the embodiment.
Figure 5:
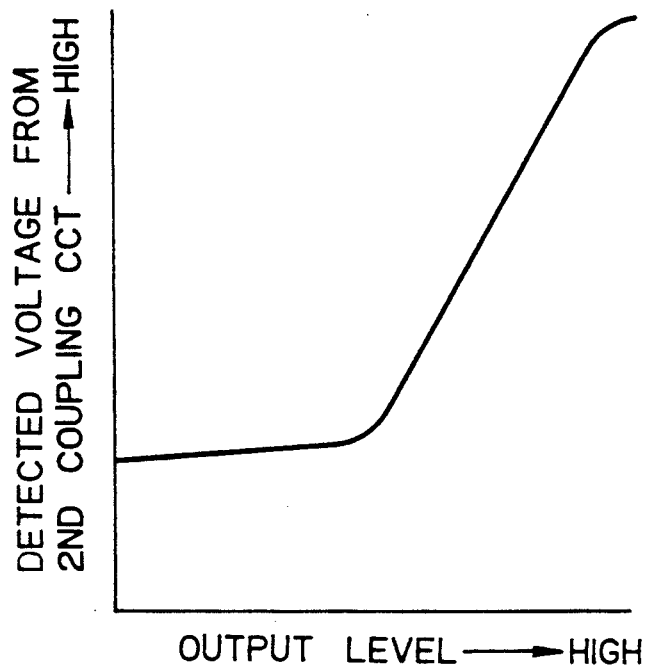
FIG. 5 is a graph showing a relation between the output level of an amplifier and a signal detected by a second detecting circuit also included in the embodiment.
Figure 6:
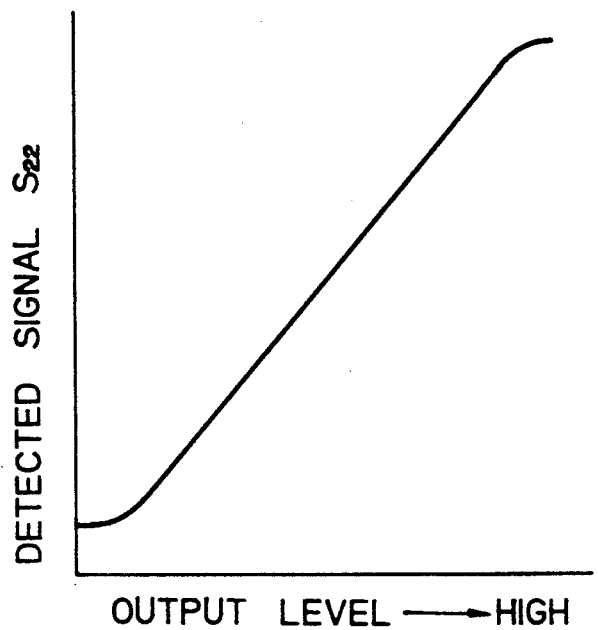
FIG. 6 is a graph showing a relation between the output level of an amplifier and a detected signal outputted by the detector of FIG. 3.

The first and second detecting circuits 26 and 28 may each be implemented as a conventional circuit using a diode. The requisite is that the detecting circuit 26 exhibits linearity against relatively low input levels, as shown in FIG. 4, while the detecting circuit 28 shows linearity against relatively high input levels, as shown in FIG. 5. The detected voltages $S_{16}$ and $S_{20}$ from the detecting circuits 26 and 28 are mixed by the mixer 30, whereby the detected signal $S_{22}$ is produced. The mixer 30 multiplies the detected voltage $S_{16}$ by x (e.g. 2), multiplies the detected voltage $S_{20}$ by $1/y$ (e.g. ½), and then mixes the multiplied voltages. As a result, the detected signal or $S_{22}$ has linearity over a broad range, as shown in FIG. 6.

Figure 7:
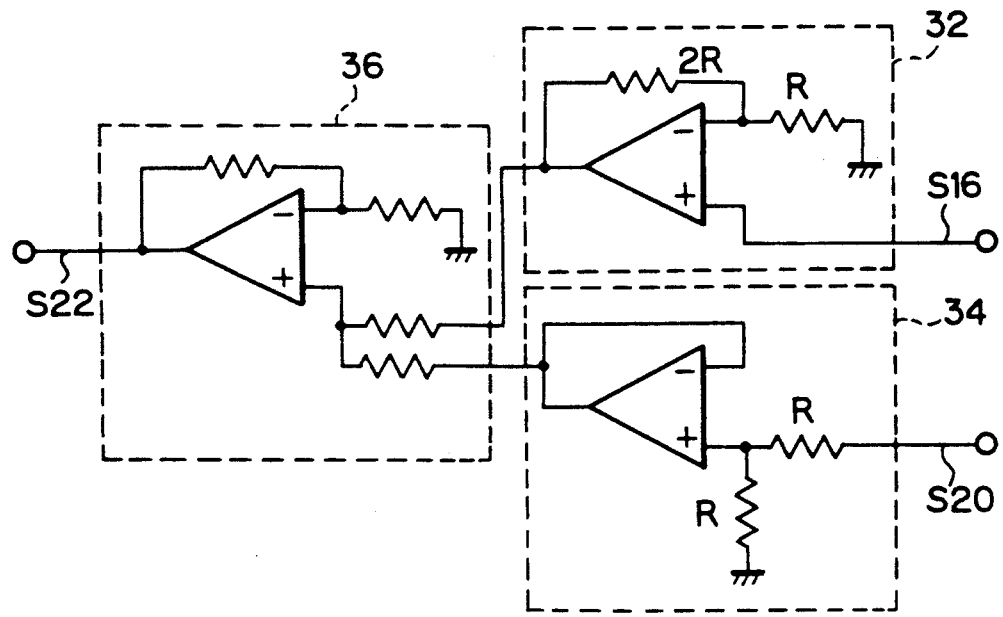
FIG. 7 is a circuit diagram showing a specific construction of a mixer included in the embodiment.

FIG. 7 shows a specific construction of the mixer 30 stated above. As shown, the mixer 30 has a first input circuit 32 for multiplying the detected output $S_{16}$ from the first coupling circuit 26 by x, a second input circuit 34 for multiplying the detected output $S_{20}$ from the second coupling circuit 28 by $1/y$, and an output circuit 36 for mixing the outputs of the input circuits 32 and 34 to produce the detected signal $S_{22}$.

In summary, it will be seen that the present invention provides a detector capable of producing a detected signal with sufficient linearity even when the output level of an amplifier changes over a broad range and, therefore, detecting changes in the output level of an amplifier with unprecedented accuracy. This advantage is derived from a unique configuration wherein the detected voltage from a detecting circuit having linearity against low amplifier output levels and the detected voltage from a detecting circuit having linearity against high amplifier output levels are combined.

Various modifications will become possible for those skilled in the art after receiving the teachings of the present disclosure without departing from the scope thereof.

What is claimed is:

1. A detector connected to an amplifier which amplifies an input signal whose level changes for generating a detected signal associated with an output signal of said amplifier, said detector comprising:
   a first coupling circuit for picking up the output signal of the amplifier in a predetermined coupling amount;
   a second coupling circuit for picking up an output signal of said first coupling circuit in a predetermine coupling amount;
   a first detecting circuit for picking up an output signal of said first coupling circuit to produce a detected voltage which has linearity against changes in a relatively low range among changes in the level of the input signal to the amplifier;
   a second detecting circuit for detecting the output signal of said second coupling circuit to produce a detected voltage which has linearity against changes in a relatively high range among changes in the level of the input signal to the amplifier; and
   a mixer for mixing the detected voltages produced by said first and second detecting circuits in a predetermined ratio to generate the detected signal.

2. A detector as claimed in claim 1, wherein said mixer comprises:
   a first input circuit for multiplying the detected voltage from said first detecting circuit by x;
   a second input circuit for multiplying the detected voltage from said second detecting circuit by $1/y$; and
   an output circuit for mixing outputs of said first and second input circuits to thereby produce the detected signal.

* * * * *